United States Patent
Lee et al.

(10) Patent No.: US 9,525,045 B1
(45) Date of Patent: Dec. 20, 2016

(54) SEMICONDUCTOR DEVICES AND METHODS FOR FORMING THE SAME

(71) Applicant: VANGUARD INTERNATIONAL SEMICONDUCTOR CORPORATION, Hsinchu (TW)

(72) Inventors: Chia-Hao Lee, New Taipei (TW); Pei-Heng Hung, New Taipei (TW); Chih-Cherng Liao, Jhudong Township (TW); Jun-Wei Chen, Hsinchu (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/066,519

(22) Filed: Mar. 10, 2016

(51) Int. Cl.
| | |
|---|---|
| H01L 29/66 | (2006.01) |
| H01L 29/78 | (2006.01) |
| H01L 29/06 | (2006.01) |
| H01L 27/088 | (2006.01) |
| H01L 21/223 | (2006.01) |
| H01L 29/423 | (2006.01) |

(52) U.S. Cl.
CPC ....... *H01L 29/66734* (2013.01); *H01L 21/223* (2013.01); *H01L 27/088* (2013.01); *H01L 29/0634* (2013.01); *H01L 29/0638* (2013.01); *H01L 29/42368* (2013.01); *H01L 29/42376* (2013.01); *H01L 29/7813* (2013.01)

(58) Field of Classification Search
CPC .................................................. H01L 29/0638
See application file for complete search history.

(56) References Cited

U.S. PATENT DOCUMENTS

2001/0031551 A1* 10/2001 Hshieh ................ H01L 29/7813
438/637

FOREIGN PATENT DOCUMENTS

| TW | 529166 B | 4/2003 |
|---|---|---|
| TW | I256676 B | 6/2006 |
| TW | I270179 B | 1/2007 |
| TW | 201238050 A1 | 9/2012 |
| TW | I397182 B1 | 5/2013 |

* cited by examiner

*Primary Examiner* — Thanhha Pham
(74) *Attorney, Agent, or Firm* — Birch, Stewart, Kolasch & Birch, LLP

(57) ABSTRACT

A semiconductor device and a method for forming the same are provided. The semiconductor device includes a substrate having a first conductive type and an epitaxial layer having the first conductive type disposed over the substrate, wherein a trench is formed in the epitaxial layer. The semiconductor device also includes a polysilicon layer having the first conductive type disposed in the trench. The semiconductor device further includes a doped region having a second conductive type disposed along a sidewall and a bottom of the trench in the epitaxial layer, wherein a thickness along the sidewall and the bottom of the trench is uniform, and wherein the thickness is a vertical distance between the outermost side of the trench to the sidewall or the bottom of the trench.

20 Claims, 10 Drawing Sheets

SEMICONDUCTOR DEVICES AND METHODS FOR FORMING THE SAME

BACKGROUND OF THE INVENTION

Field of the Invention

The present invention relates to semiconductor devices, and in particular to trench metal oxide semiconductor field effect transistors (Trench MOSFETs) and methods for fabricating the same.

Description of the Related Art

Technology that includes high-voltage elements is implemented to integrated circuits with a high voltages and high power. In order to achieve high-withstand voltage and high current, the flow of the driving current in a conventional power transistor is developed from a horizontal direction to a vertical direction. A metal oxide semiconductor field-effect transistor (MOSFET) having a trench gate has been developed that is capable of effectively reducing on-resistance (Ron) and processing high currents.

In recent years, the Trench MOSFET has seen significant development in the field of computers and consumer electronics. Currently, the technology of the Trench MOSFET has been widely accepted in the market for MOSFET, and the Trench MOSFET has a high market share. However, there are still many improvements that are required in the capability of high-withstand voltage in the Trench MOSFET.

Therefore, it is necessary to search the Trench MOSFET devices and methods for fabricating the same that can solve or improve the problems describe above.

BRIEF SUMMARY OF THE INVENTION

The disclosure provides a semiconductor device. The semiconductor device includes a doped region formed by a thermal diffusion process though a trench such that the thickness of the trench along the sidewall and the bottom of the trench is uniform. Therefore, the breakdown voltage of the semiconductor device is increased and the risk of leakage is decreased.

The disclosure provides a semiconductor device. The semiconductor device includes a substrate having a first conductive type and an epitaxial layer having the first conductive type disposed over the substrate, wherein a trench is formed in the epitaxial layer. The semiconductor device also includes a polysilicon layer having the first conductive type disposed in the trench. The semiconductor device further includes a doped region having a second conductive type in the epitaxial layer and disposed along a sidewall and a bottom of the trench, wherein a thickness of the trench along the sidewall and the bottom of the trench is uniform, and wherein the thickness of the doped region is a vertical distance between the outermost side of the doped region to the sidewall and the bottom of the trench.

The disclosure provides a method for forming a semiconductor device. The method includes providing a substrate having a first conductive type and forming an epitaxial layer having the first conductive type over the substrate. The method also includes forming a trench in the epitaxial layer. The methods further includes forming a doped region having a second conductive type in the epitaxial layer through the trench by a thermal diffusion process, wherein the doped region is extended along the a sidewall and a bottom of the trench and a thickness of the doped region along the sidewall and the bottom of the trench is uniform, and wherein the thickness the doped region is a vertical distance between the outermost side of the doped region to the sidewall and the bottom of the trench. The method further includes filling a polysilicon layer having the first conductive type in the trench.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
FIGS. 1A to 1L are cross-sectional representations of various stages of forming a semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A to 1L are cross-sectional representations of various stages of forming a semiconductor device 100 in accordance with some embodiments. At first, referring to FIG. 1A, a semiconductor substrate 101 is received. The semiconductor substrate 101 is a bulk semiconductor substrate, such as a semiconductor wafer which has a first conductive type. In some embodiments, the semiconductor substrate 101 includes silicon or other elementary semiconductor materials such as germanium. In some embodiments, semiconductor substrate 101 may include compound semiconductor. The compound semiconductor may include gallium arsenide, silicon carbide, indium arsenide, indium phosphide, another suitable compound semiconductor, or a combination thereof. In some embodiments, the conductive type of the semiconductor substrate 101 is n-type.

Figure 1B:

Referring to FIG. 1B, an epitaxial layer 102 is formed over the semiconductor substrate 101. The epitaxial layer 102 has the first conductive type (e.g. n-type) same as that of the semiconductor substrate 101 and is disposed on the semiconductor substrate 101. The epitaxial layer 102 may formed by Epitaxial Growth process such as chemistry vapor deposition (CVD) process, Liquid Phase Epitaxy (LPE) process, Solid Phase Epitaxy (SPE) process, Molecular Phase Epitaxy (MPE) process, another suitable processes, or a combination thereof.

Figure 1C:
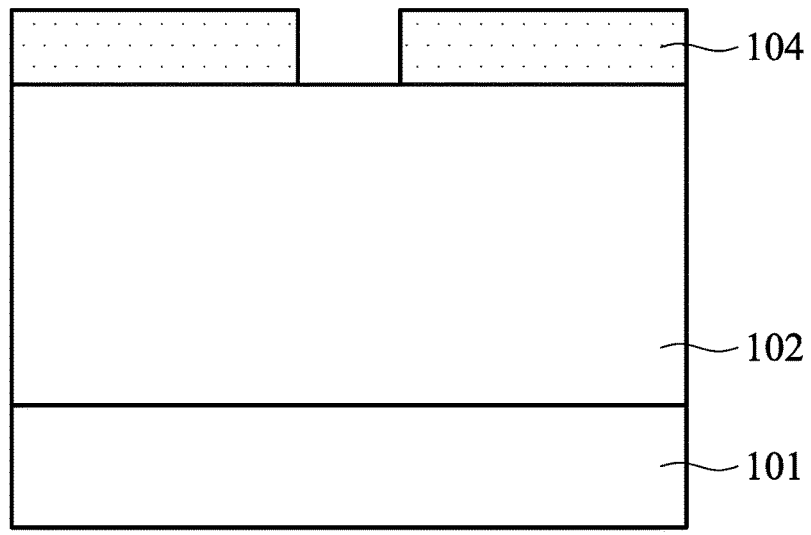
Figure 1D:
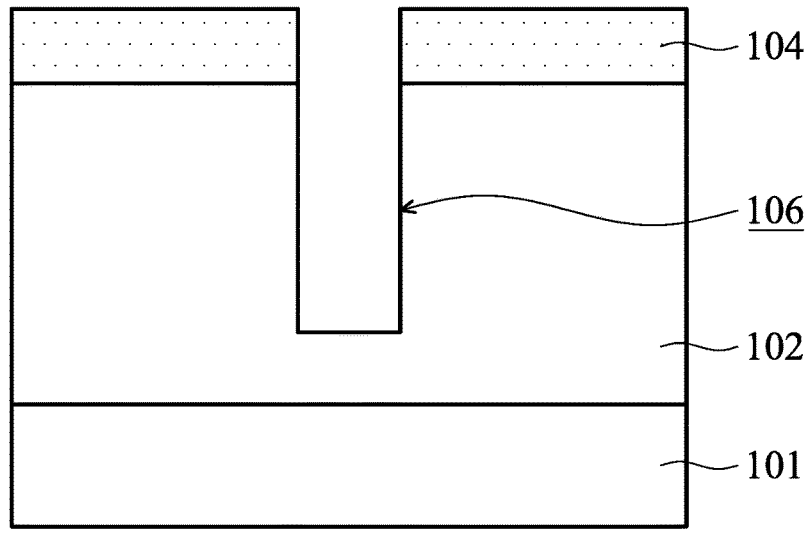

Referring to FIG. 1C, a patterned photoresist layer 104 is formed over the epitaxial layer 102. The patterned photoresist layer 104 may be formed by photolithography patterning processes include photoresist coating (e.g., spin-on coating), soft baking, mask aligning, exposure, post-exposure baking, developing the photoresist, rinsing, drying (e.g., hard baking), other suitable processes, or a combination thereof. The photolithography exposing process can be replaced by other appropriate methods such as maskless photolithography, electron-beam writing, ion-beam writing, or molecular imprint. After the patterned photoresist layer 104 is formed, as shown in FIG. 1D, a trench 106 is formed in the substrate 102 by performing an etching process on the epitaxial layer 102 through an opening of the patterned photoresist layer 104. The etching processes include dry etching, wet etching, or other etching methods (e.g. reactive ion etching). The etching process is also either purely chemical etching (plasma etching), purely physical etching (ion milling), or a combination thereof.

Figure 1E:
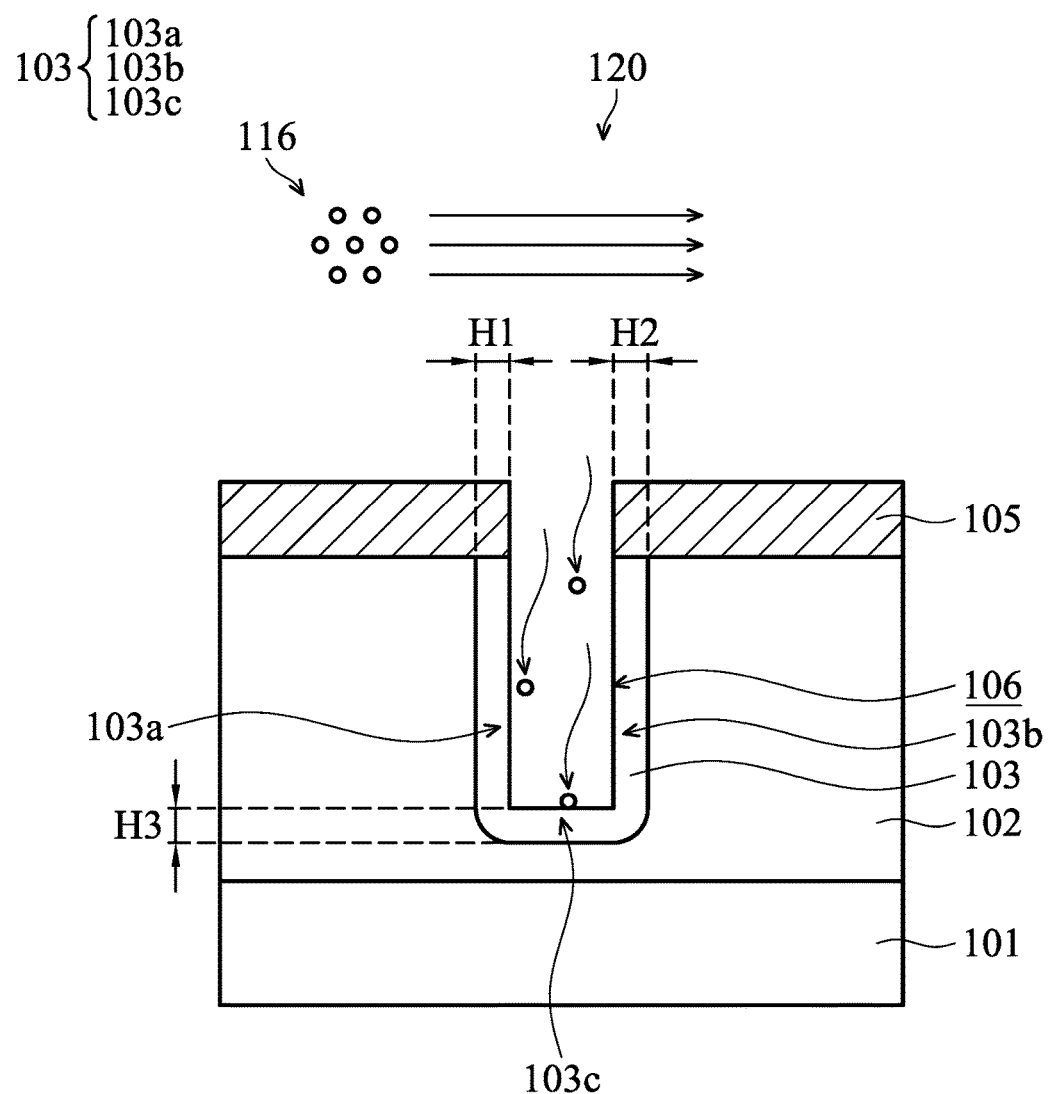

Referring to FIG. 1E, after forming the trench 106, the photoresist layer 104 is removed, and a mask layer 105 is formed on the epitaxial layer 102. The mask layer 105 may be made of silicon nitride, silicon oxynitride, silicon carbide, silicon oxide, silicon carbon nitride, photoresist, another suitable material, or a combination thereof. An opening of the mask layer 105 is formed by a patterned process to correspond to the position of the trench 106. The mask layer 105 may be formed using a chemical vapor deposition (CVD) process, an atomic layer deposition (ALD) process, a physical vapor deposition (PVD) process, another applicable process, or a combination thereof. In some embodiments, the mask layer 105 is formed from silicon nitride.

As shown in FIG. 1E, after the trench 106 and the mask layer 105 are formed, a thermal diffusion process 120 is used such that a dopant 116 is penetrated into the epitaxial layer 102 through the opening of the mask layer 105 and the trench 106 to form a doped region 103. As shown in FIG. 1E, the doped region 103 is formed after the dopant 116 is penetrated into the epitaxial layer 102 through the trench 106, and the doped region 103 is located on two opposite sidewalls and the bottom of the trench 106. The doped region 103 has the second conductive type. In some embodiments, the first conductive type is n-type, and the second conductive type is p-type. In this embodiment, the dopant 116 is a gas of boron containing compound such as boron tribromide ($BBr_3$) or diborane ($B_2H_6$), and the doping concentration of the doped region 103 is in a range between about $10^{19}$ and $10^{21}$ $cm^{-3}$.

In other some embodiments, the first conductive type is p-type, and the second conductive type is n-type. In this embodiment, the dopant 116 is a gas of phosphorus containing compound such as phosphorus oxide trichloride ($POCl_3$), and the doping concentration of the doped region 103 is in a range between about $10^{19}$ and $10^{21}$ $cm^{-3}$.

The process temperature of the thermal diffusion process 120 is in a range between about 850° C. and 1050° C., and the process time of the thermal diffusion process 120 is in a range between 600 and 900 seconds.

Since the doped region 103 is formed by the thermal diffusion process 120, the thickness along the bottom and the two opposite sidewalls of the trench 106 is uniform, wherein the thickness of the doped region 103 is defined by a vertical distance measured between the outermost side of the doped region 103 to the sidewalls and the bottom of the trench 106. As shown in FIG. 1E, the doped region 103 includes a first portion 103a on the left side of the trench 106, a second portion 103b on the right side of the trench 106 and a third portion 103c under the bottom of the trench 106, wherein the first portion 103a has a thickness $H_1$, the second portion 103b has a thickness $H_2$ and the third portion 103c has a thickness $H_3$. The thickness of the doped region 103 formed by the method mentioned above is dependent on the sort of dopant, the process temperature and the process time of the thermal diffusion process 120, and the thickness of the doped region 103 might not be changed with the change of the depth or the position of the trench 106. Namely, the thickness $H_1$ of the first portion 103a of the doped region 103 from the top of the trench 106 to the bottom of the trench 106 is uniform, the thickness $H_2$ of the second portion 103b of the doped region 103 from the top of the trench 106 to the bottom of the trench 106 is uniform, and the thickness $H_3$ of the third portion 103c of the doped region 103 under the bottom of the trench 106 is also uniform. In addition, the thickness $H_1$ of the first portion 103a, the thickness $H_2$ of the second portion 103b and the thickness $H_3$ of the third portion 103c are all the same. Further, the first portion 103a, the second portion 103b and the third portion 103c of the doped region 103 are formed simultaneously by the thermal diffusion process 120.

If the epitaxial layer 102 is doped by the dopant through the trench 106 by known ion implant process, then the thickness of the doped region will be influenced by the depth of the trench. For example, in a trench having high aspect ratio, the thickness of the doped region on the sidewall near the bottom portion of the trench will be thinner than the doped region on the sidewall near the top portion of the trench due to the limit of the ion implant process. It causes that the thickness and the doping concentration of the doped region on the peripheral of the trench are not uniform, and the semiconductor device may occur leakage. In this embodiment of the disclosure, the thickness of the doped region 103 formed by the thermal diffusion process 120 along the two opposite sidewalls and the bottom of the trench 106 is uniform, and the doping concentration of the doped region 103 along the two opposites and the bottom of the trench 106 is also uniform. Therefore, the semiconductor device formed by the method mentioned above is less likely to occur leakage and the threshold voltage (Vt) of the semiconductor device is easily to control. In addition, the aspect ratio of the trench 106 is not confined due to the free of the limitation of the implant process, and thereby the process window of the semiconductor device is increased. In some embodiments, the aspect ratio of the trench 106 is in a range of about 1 to 4 (If the width is 1, then the depth is between 1 and 4).

In addition, the mask layer 105 may prevent the dopant 116 penetrating to the area beyond the peripheral of the trench 106 during the thermal diffusion process 120. Compared to silicon oxide, photoresist or other materials, it has better protective ability to use silicon nitride as the mask layer 105, and the desired thickness of the mask layer 105 made of silicon nitride is lower than other materials.

Figure 1F:
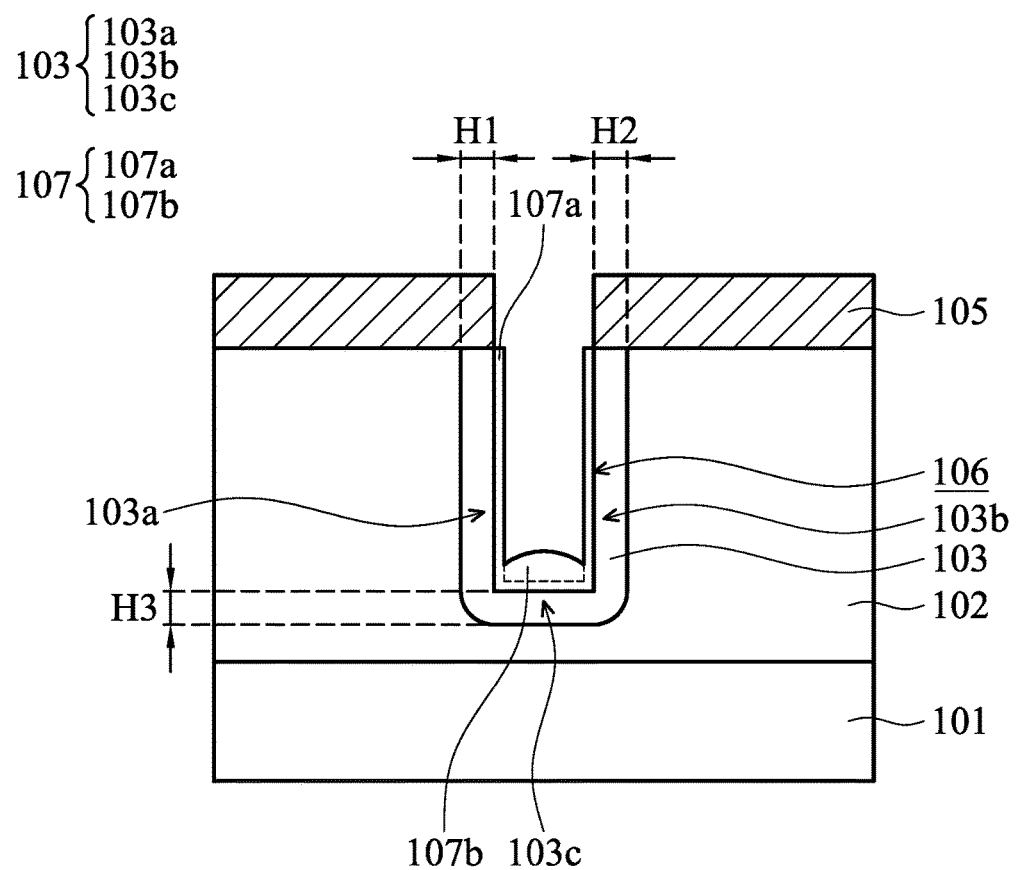

Referring to FIG. 1F, after the doped region 103 is formed, an oxide layer 107 is formed in the trench 106. The oxide layer 107 may be formed using the CVD process, the PVD process, thermal oxidation or another applicable process. The material of the oxide layer 107 includes silicon oxide, silicon oxynitride, another applicable material, or a combination thereof. The details of formation of the oxide layer 107 are as follows: At first, a sacrificed oxide (not shown) is formed and etched in the trench 106, and a gate oxide layer 107a is formed in the trench 106. After the gate oxide layer 107a is formed, a dielectric layer (not shown) is deposited on the surface of the gate oxide layer 107a. The material of the dielectric layer includes silicon nitride, silicon oxynitride, another applicable material. After the dielectric layer is deposited, an etching process is preformed to etch the dielectric layer on the bottom surface of the gate oxide layer 107a and the dielectric layer on the sidewall of the gate oxide layer 107a is remained. Next, a thermal oxidation process is performed to grow a convex oxide layer 107b and an etching process is preformed to etch the remaining dielectric layer, and the oxide layer 107 is formed. As shown in FIG. 1F, the oxide layer 107 includes the gate oxide layer 107a and the convex oxide layer 107b.

Figure 1G:
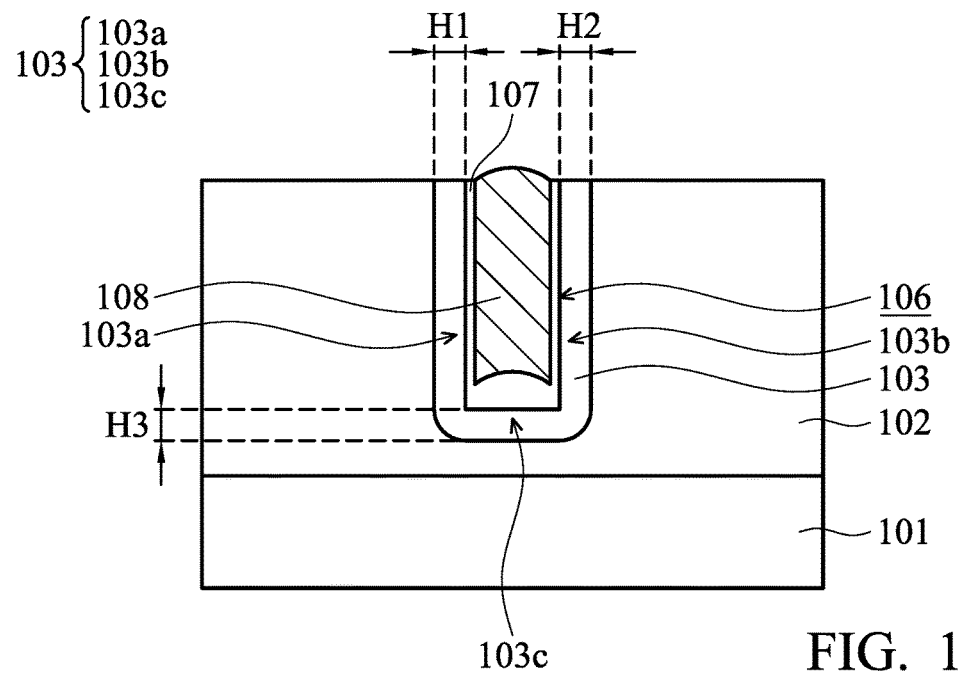

Referring to FIG. 1G, after the oxide layer 107 is formed, the mask layer 105 is removed and a polysilicon layer 108 is deposited to fill in the trench 106. In some embodiments, the mask layer 105 may be removed by an etching process such as wet etching or dry etching. In some embodiments, the polysilicon layer 108 is formed by using a gas containing silicon such as dichloromethane (DCS), silane ($SiH_4$), Methoxysilane ($SiCH_6$), another applicable process, or a combination thereof. The polysilicon layer 108 may be formed using a CVD process, a PVD process or another applicable process. In addition, the polysilicon layer 108 may be doped with dopant to have the first conductive type. The polysilicon layer 108 is used as a gate of the Trench MOSFETs.

Figure 1H:
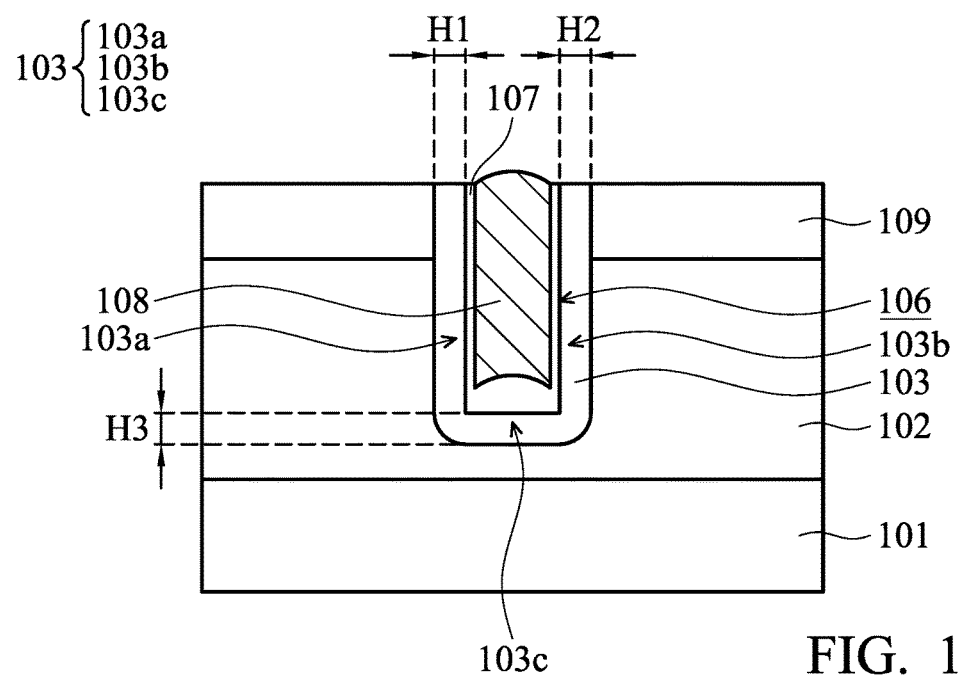
Figure 1:
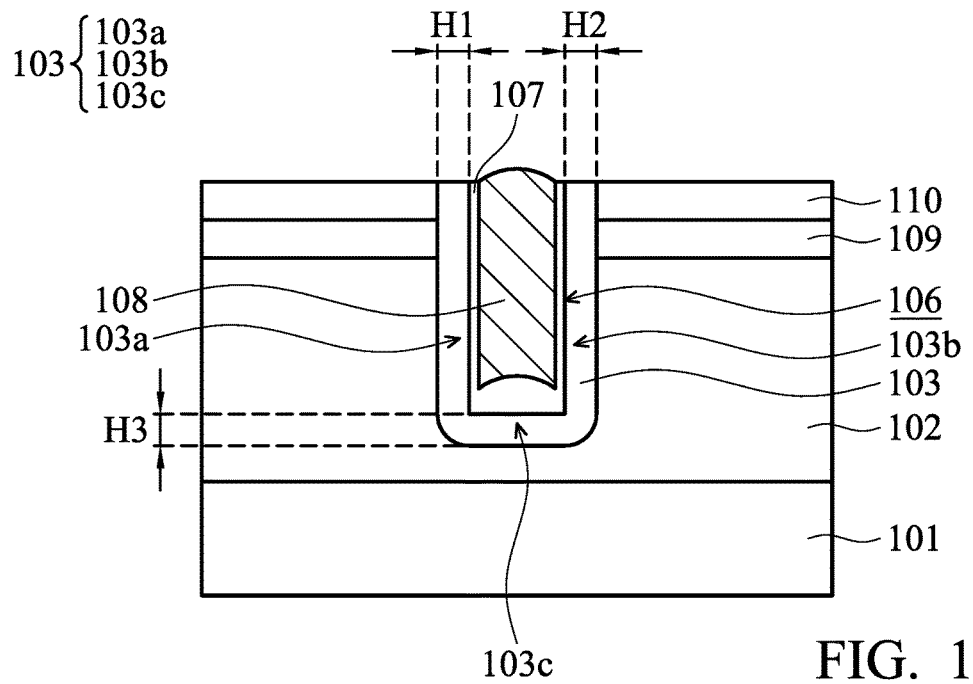
Figure 1:
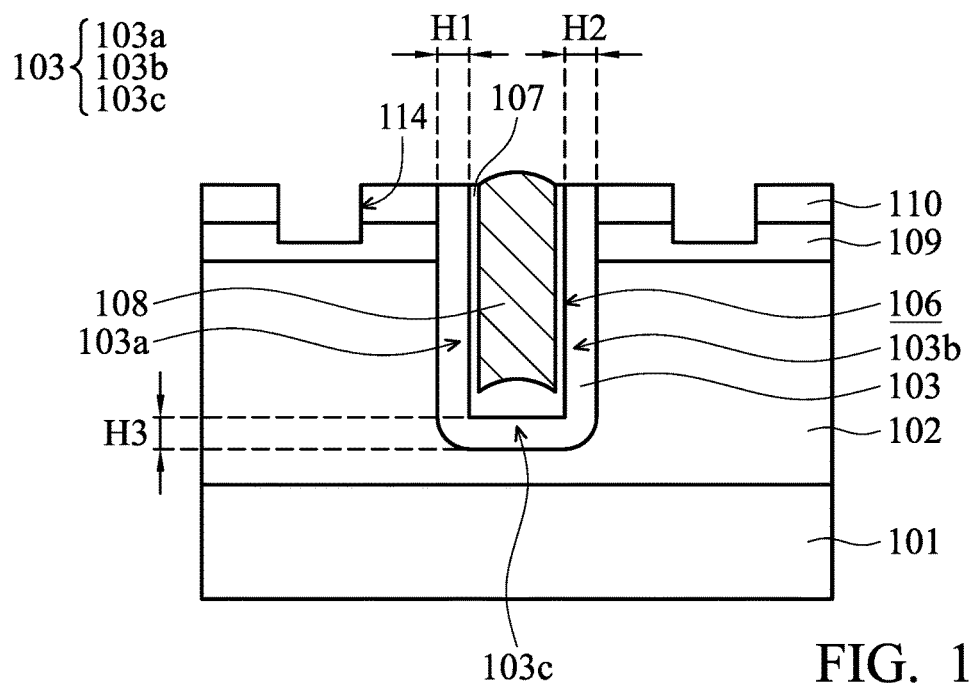

Referring to FIGS. 1H-1I, after the trench 106 is filled in with the polysilicon layer 108, a well region 109 and a heavily doped region 110 are formed. As shown in FIG. 1H, the well region 109 is formed in the epitaxial layer 102 and on the two sides of the doped region 103 to surround the trench 106. As shown in FIG. 1I, the heavily doped region 110 is formed in the epitaxial layer 102 and above the well region 109. The well region 109 has the second conductive type, and the heavily doped region 110 has the first conductive type. In some embodiments, the conductive type of the well region 109 is p-type, and the conductive type of the heavily doped region 110 is n-type. The well region 109 and the heavily doped region 110 may be formed by the ion implant process. The well region 109 is formed to define a channel region of the Trench MOSFETs, the heavily doped region 110 is formed to define a source region of the Trench MOSFETs, the undoped epitaxial layer 102 is formed to define a drift region of the Trench MOSFETs, and the semiconductor substrate 101 is used as a drain region of the Trench MOSFETs.

Referring to FIG. 1J, after the well region 109 and the heavily doped region 110 are formed, an opening 114 is formed over the surface of the epitaxial layer 102 by using the etching process. The opening 114 penetrates through the heavily doped region 110 and a portion of the well region 109. The etching processes include dry etching, wet etching, or other etching methods (e.g., reactive ion etching). The etching process is also either purely chemical etching (plasma etching), purely physical etching (ion milling), or a combination thereof.

Figure 1K:
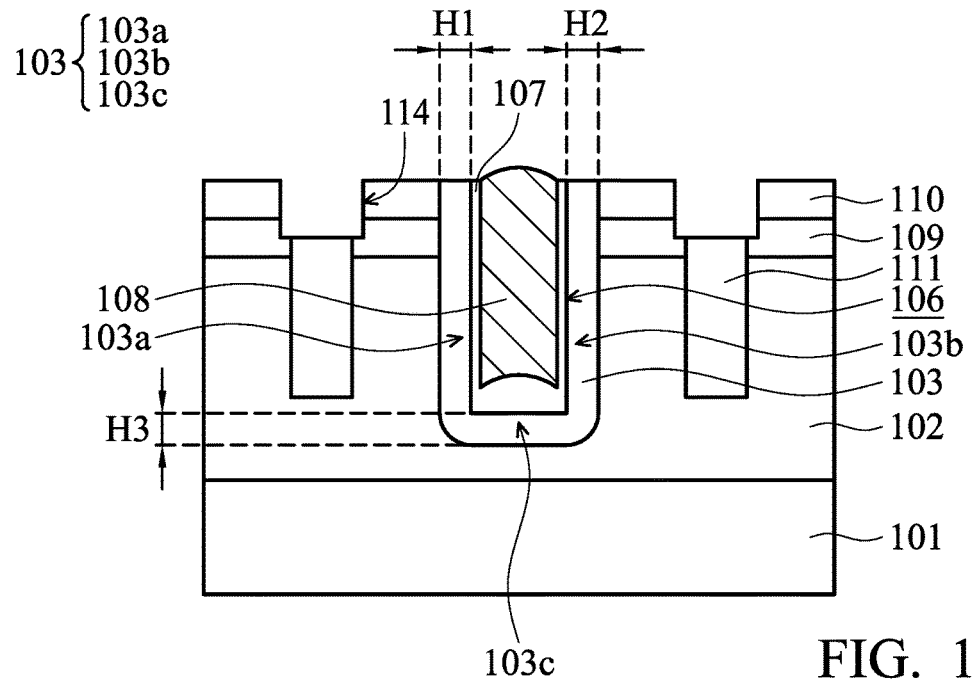

Referring to FIG. 1K, after the opening 114 is formed, a reduced surface field doped region 111 is formed by performing an implant process on the epitaxial layer 102. The reduced surface field doped region 111 is disposed in the epitaxial layer 102 and in a portion of the well region 109, and the reduced surface field doped region 111 has the second conductive type. In some embodiments, the conductive type of the reduced surface field doped region 111 is p-type. Because the reduced surface field doped region 111 has the second conductive type different from that of the semiconductor substrate 101 and the epitaxial layer 102, a surface area of an interface between the first conductive type (e.g. the epitaxial layer 102) and the second conductive type (e.g. the well region 109 and the reduced surface field doped region 111) is increased to make charge balance between two different conductive types. Therefore, the breakdown voltage of the semiconductor device 100 (e.g. Trench MOSFET) as shown in FIG. 1L is increased and the performance of the semiconductor device 100 is improved.

Figure 1L:
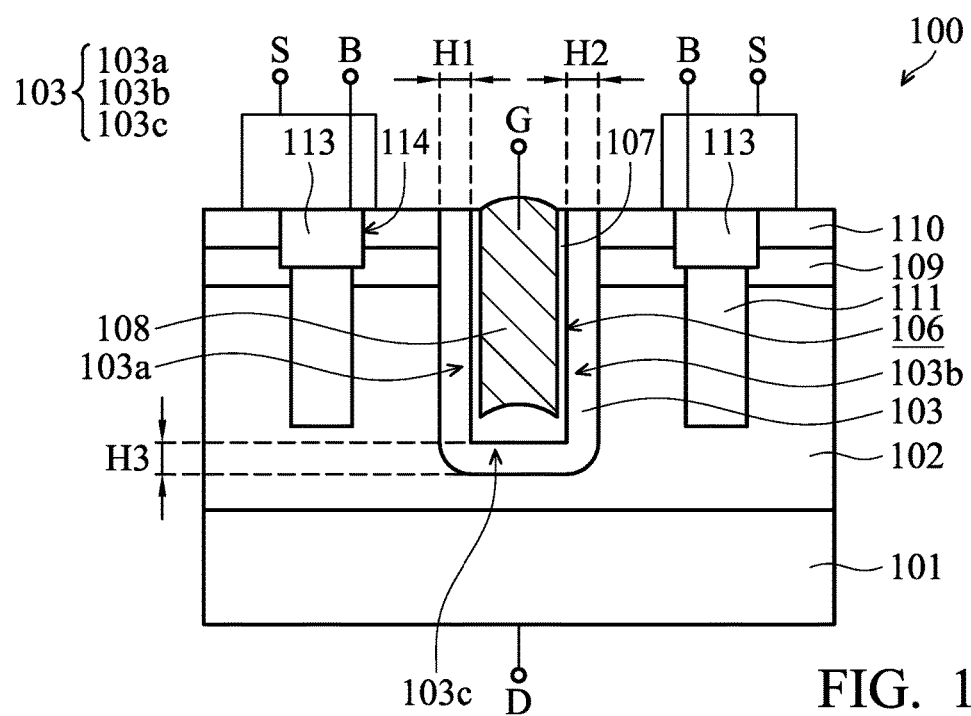

Referring to FIG. 1L, after the reduced surface field doped region 111 is formed, a metal material is deposited to fill in the opening 114 to form a metal layer 113, and the semiconductor device 100 is completed. The material of the metal layer 113 includes tungsten, copper, another applicable metals or alloys. The metal layer 113 may be formed using a PVD process, an ALD process, or other applicable process. The metal layer 113 is formed to define a body region of the Trench MOSFETs and may be electrically connected to other conductive elements. As shown in FIG. 1L, the semiconductor device 100 includes the polysilicon layer 108 as the gate, the heavily doped region 110 as the source region, the metal layer 113 as the body region and the semiconductor substrate 101 as the source region.

Figure 2:
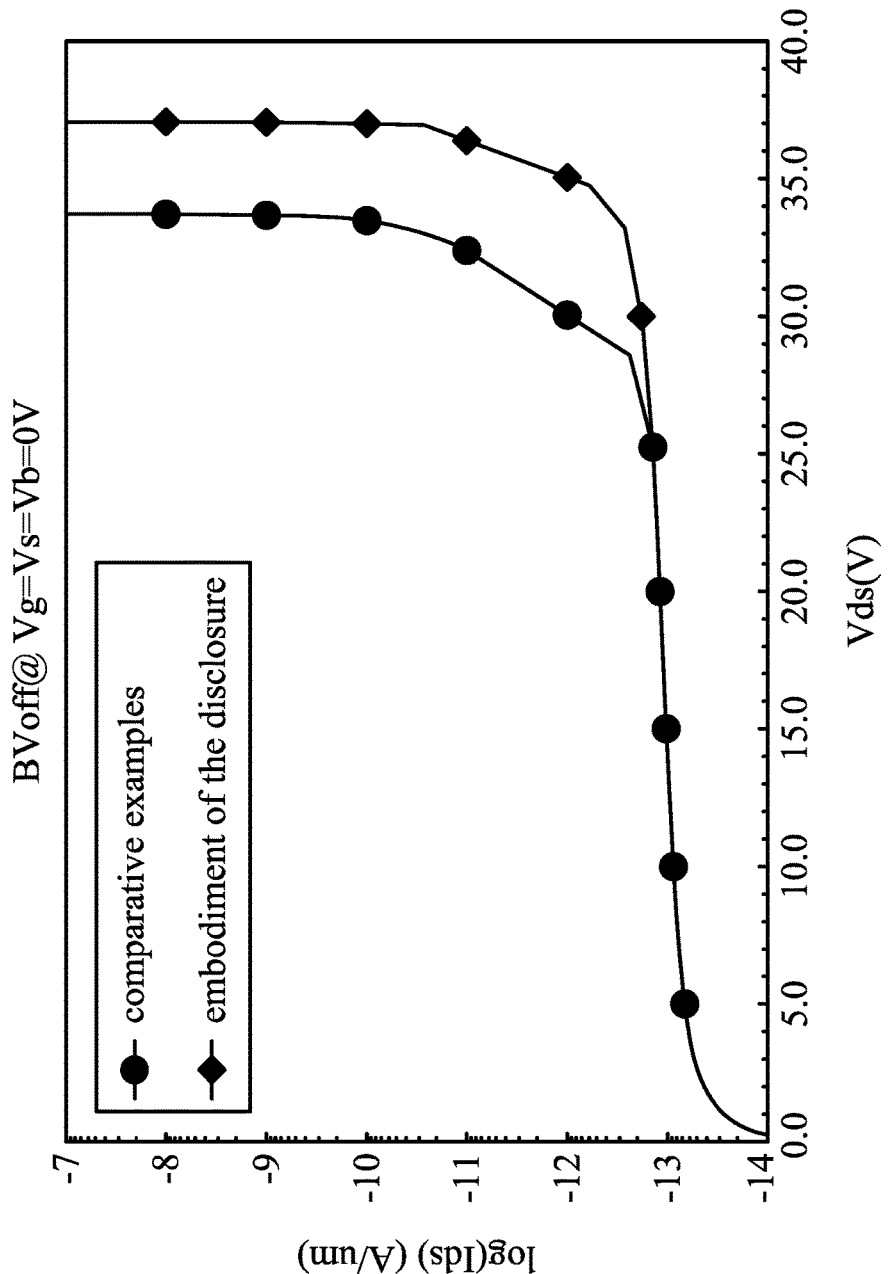
FIG. 2 is an electrical test chart that shows the improvement and testing results of embodiments and semiconductor device of comparative examples, in accordance with some embodiments.

FIG. 2 is an electrical test chart that shows the improvement and testing results of embodiments and semiconductor device of comparative examples, in accordance with some embodiments. The horizontal axis of FIG. 2 represents the breakdown voltage of the semiconductor device, and the vertical axis of FIG. 2 represents the current of the semiconductor device. The difference between the semiconductor device of the embodiments of the disclosure and the comparative example of the semiconductor devices is the forming method, wherein the doped region of the semiconductor device of the embodiment of the disclosure is formed by thermal diffusion, and the doped region of the semiconductor device of the comparative examples is formed by ion implant process. As shown in FIG. 2, when the gate bias ($V_g$), the source bias ($V_s$) and the body bias ($V_b$) are 0V, the semiconductor device of the embodiment of the disclosure has greater breakdown voltage than the semiconductor device of comparative examples.

Figure 3:
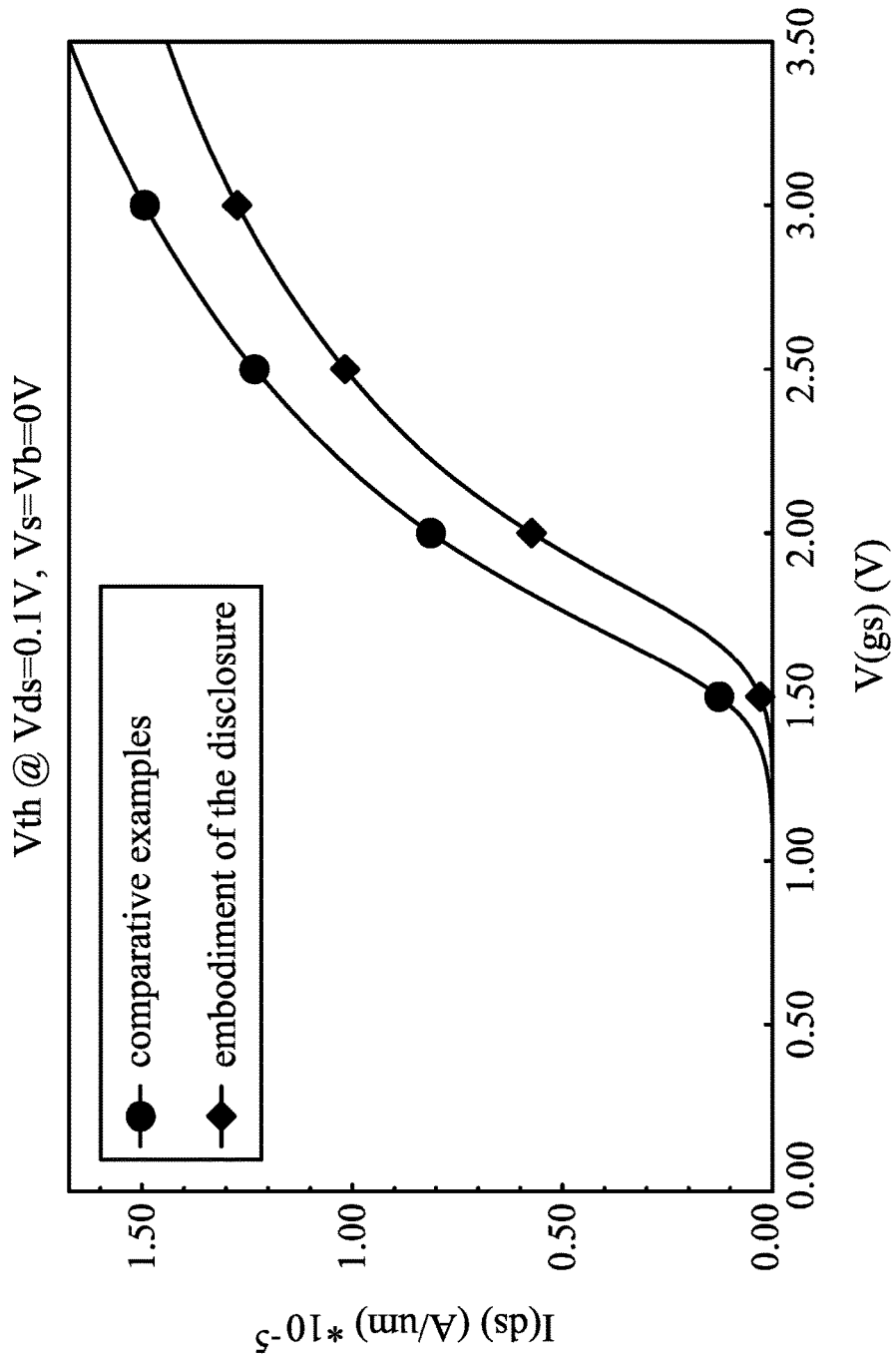
FIG. 3 is an electrical test chart that shows the improvement and testing results of embodiments and semiconductor device of comparative examples, in accordance with some embodiments.

Referring to FIG. 3, FIG. 3 is an electrical test chart that shows the improvement and testing results of embodiments and semiconductor device of comparative examples. The horizontal axis of FIG. 3 represents the threshold voltage of the semiconductor device, and the vertical axis of FIG. 3 represents the current of the semiconductor device. As shown in FIG. 3, when the source bias ($V_s$) and the body bias ($V_b$) are 0V, and the drain-source voltage ($V_{ds}$) is 0.1V, the semiconductor device of the embodiment of the disclosure has greater threshold voltage than the semiconductor device of comparative examples.

Figure 4:
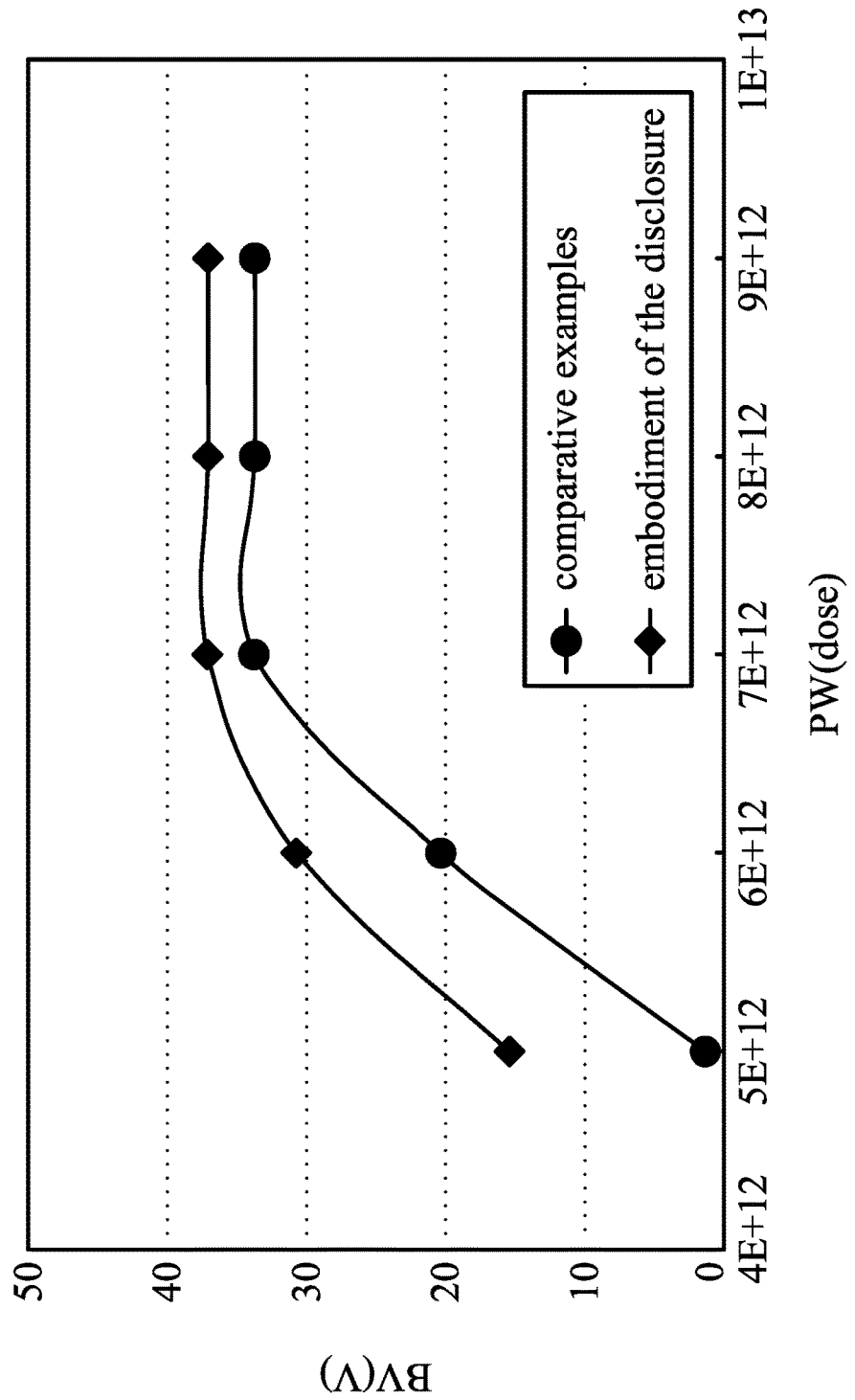
FIG. 4 is an electrical test chart that shows the improvement and testing results of embodiments and semiconductor device of comparative examples, in accordance with some embodiments.

Referring to FIG. 4, FIG. 4 is an electrical test chart that shows the improvement and testing results of embodiments and semiconductor device of comparative examples. The horizontal axis of FIG. 4 represents the dopant dose of the well region of the semiconductor device, and the vertical axis of FIG. 4 represents the breakdown voltage of the semiconductor device. As shown in FIG. 4, when the dopant dose of the well region of the embodiment of the disclosure and the dopant dose of the well region of the semiconductor device of comparative examples are the same, the semiconductor device of the embodiment of the disclosure has greater breakdown voltage than the semiconductor device of comparative examples.

As shown in FIGS. 2-4, compared to the semiconductor device using the implant process to form the doped region, the semiconductor device of the embodiment of the disclosure, using the thermal diffusion process to form the doped region along the two sides and the bottom of the trench, has greater breakdown voltage and threshold voltage. In addition, when the dopant dose of the well region of the embodiment of the disclosure and the dopant dose of the well region of the semiconductor device of comparative examples are the same, the semiconductor device of the embodiment of the disclosure, using the thermal diffusion process to form the doped region along the two sides and the bottom of the trench, also has greater breakdown voltage.

In conclusion, since the doped region in the epitaxial layer along the peripheral of the trench of the semiconductor device of the embodiment of the disclosure is formed by using the thermal diffusion process, the doped region along the peripheral of the trench has the characteristic with the uniform thickness and uniform doping concentration. Compared to the semiconductor device of comparative examples using the ion implant process, the semiconductor device of the embodiment of the disclosure has lower on-state resistance (RDS(on)) and higher breakdown voltage to reduce the risk of leakage. Further, the doped region in the epitaxial layer along the peripheral of the trench formed by thermal diffusion is not confined to the limitation of the implant process. Therefore, the aspect ratio of the trench and the process window of the semiconductor device have more flexibility, and the layout of the semiconductor of embodiments become more versatile.

In addition, the semiconductor devices and the methods for forming the same of embodiments may be applied in low voltage, high voltage and extremely high voltage elements such as high electron mobility transistor (HEMT), insulated gate bipolar transistor (IGBT).

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
   a substrate having a first conductive type;
   an epitaxial layer having the first conductive type disposed over the substrate, wherein a trench is formed in the epitaxial layer;
   a polysilicon layer having the first conductive type disposed in the trench; and
   a doped region having a second conductive type disposed in the epitaxial layer along a sidewall and a bottom of the trench, wherein a thickness of the doped region along the sidewall and the bottom of the trench is uniform, and wherein the thickness is a vertical distance between an outermost side of the doped region to the sidewall and the bottom of the trench.

2. The semiconductor device as claimed in claim 1, further comprising:
   a well region having the second conductive type disposed on two sides of the doped region over the epitaxial layer; and
   a heavily doped region having the first conductive type disposed over the well region.

3. The semiconductor device as claimed in claim 2, wherein the polysilicon layer is a gate of the semiconductor device, the well region is a channel region of the semiconductor device, the heavily doped region is a source of the semiconductor device, and the substrate is a drain of the semiconductor device.

4. The semiconductor device as claimed in claim 1, wherein a doping concentration of the doped region along the sidewall and the bottom of the trench is uniform.

5. The semiconductor device as claimed in claim 1, wherein an aspect ratio of the trench is between 1 and 4.

6. The semiconductor device as claimed in claim 1, wherein the first conductive type is n-type, and the doped region has a dopant comprising boron, boron containing compound or a combination thereof.

7. The semiconductor device as claimed in claim 6, wherein the doping concentration of the doped region is in a range between $10^{19}$ and $10^{21}$ cm$^{-3}$.

8. The semiconductor device as claimed in claim 1, wherein the first conductive type is p-type, and the doped region has a dopant comprising phosphorus, phosphorus containing compound or a combination thereof.

9. The semiconductor device as claimed in claim 8, wherein the doping concentration of the doped region is in a range between $10^{19}$-$10^{21}$ cm$^{-3}$.

10. The semiconductor device as claimed in claim 2, further comprising:
    a reduced surface field doped region having the second conductive type disposed in the epitaxial layer and in the well region, wherein the reduced surface field doped region is separated from the trench.

11. A method for forming a semiconductor device, comprising:
    providing a substrate having a first conductive type;
    forming an epitaxial layer having the first conductive type over the substrate;
    forming a trench in the epitaxial layer;
    forming a doped region having a second conductive type in the epitaxial layer through the trench by a thermal diffusion process, wherein the doped region is extended along a sidewall and a bottom of the trench, and a thickness of the doped region along the sidewall and the bottom of the trench is uniform, and wherein the thickness of the doped region is a vertical distance between an outermost side of the doped region to the sidewall and the bottom of the trench; and filling a polysilicon layer having the first conductive type in the trench.

12. The method as claimed in claim 11, wherein a doping concentration of the doped region along the sidewall and the bottom of the trench is uniform.

13. The method as claimed in claim 11, wherein the doped region comprises a first portion and a second portion on two opposite sidewalls of the trench respectively, and a third portion under the bottom of the trench, and wherein the first portion, the second portion and the third portion are formed simultaneously.

14. The method as claimed in claim 11, wherein the first conductive type is n-type, and forming the doped region comprises using a gas of boron containing compound during the thermal diffusion process.

15. The method as claimed in claim 14, wherein the gas of boron containing compound comprises boron tribromide or diborane.

16. The method as claimed in claim 11, wherein the first conductive type is p-type, and forming the doped region comprises using a gas of phosphorus containing compound during the thermal diffusion process.

17. The method as claimed in claim 16, wherein the gas of phosphorus containing compound comprises trichloride.

18. The method as claimed in claim 11, further comprising:

forming a mask layer over the epitaxial layer before forming the doped region and after forming the trench, wherein the mask layer has an opening corresponding to the trench.

19. The method as claimed in claim 18, wherein the mask layer comprises silicon nitride.

20. The method as claimed in claim 11, further comprising:

forming a well region having the second conductive type over the epitaxial layer, and surrounding the trench after forming the doped region; and forming a heavily doped region having the first conductive type over the well region.

* * * * *